United States Patent
Chen et al.

(10) Patent No.: US 9,853,196 B2
(45) Date of Patent: Dec. 26, 2017

(54) LIGHT-EMITTING DISPLAY DEVICE

(71) Applicants: LITE-ON OPTO TECHNOLOGY (CHANGZHOU) CO., LTD., Changzhou, Jiangsu Province (CN); LITE-ON TECHNOLOGY CORPORATION, Taipei (TW)

(72) Inventors: Hung-Jui Chen, New Taipei (TW); Kuo-Ming Chiu, New Taipei (TW); Shih-Chiang Yen, Taipei (TW)

(73) Assignees: LITE-ON OPTO TECHNOLOGY (CHANGZHOU) CO., LTD., Changzhou, Jiangsu Province (CN); LITE-ON TECHNOLOGY CORPORATION, Taipei (TW)

( * ) Notice: Subject to any disclaimer, the term of this patent is extended or adjusted under 35 U.S.C. 154(b) by 41 days.

(21) Appl. No.: 15/153,317

(22) Filed: May 12, 2016

(65) Prior Publication Data
US 2017/0084804 A1    Mar. 23, 2017

(30) Foreign Application Priority Data
Sep. 17, 2015    (CN) .......................... 2015 1 0595259

(51) Int. Cl.
*H01L 29/20* (2006.01)
*H01L 33/60* (2010.01)
*H01L 25/075* (2006.01)
*H01L 33/58* (2010.01)

(52) U.S. Cl.
CPC .......... *H01L 33/60* (2013.01); *H01L 25/0753* (2013.01); *H01L 33/58* (2013.01)

(58) Field of Classification Search
CPC ................................ H01L 33/58; H01L 33/60
USPC .............................................. 257/89; 438/22
See application file for complete search history.

(56) References Cited

U.S. PATENT DOCUMENTS

| | | | |
|---|---|---|---|
| 9,507,430 B2* | 11/2016 | Chua ....................... | G06F 3/017 |
| 9,605,810 B2* | 3/2017 | Moon ..................... | F21K 9/232 |
| 2007/0030676 A1* | 2/2007 | Ichihara ................... | F21K 9/00 362/244 |
| 2008/0067531 A1* | 3/2008 | Chang .................... | H01L 33/58 257/98 |
| 2008/0303757 A1* | 12/2008 | Ohkawa ................... | F21V 5/04 345/82 |
| 2009/0027589 A1* | 1/2009 | Yamazoe .......... | G02B 27/0101 349/62 |
| 2010/0085512 A1* | 4/2010 | Ueda ................ | G02F 1/133609 349/68 |

(Continued)

*Primary Examiner* — Jami M Valentine
(74) *Attorney, Agent, or Firm* — Li & Cai Intellectual Property (USA) Office

(57) ABSTRACT

A light-emitting display device includes a substrate, several light emitting units for emitting light with different wavelengths, and an optical lens. The substrate has at least one receiver for containing these light emitting units. A light guide structure of the light-emitting display device can be the receiver with a specific designed, a frame body with at least one corresponding through hole formed on the corresponding receiver, or at least one optical element formed on the corresponding receiver, so as the light emitted by the light emitting units can be reflected towards the preset optical axis. And the optical lens is formed on the light guide structure as medium for mixing lights of different wavelengths for achieving a uniform lighting effect.

18 Claims, 9 Drawing Sheets

(56) References Cited

U.S. PATENT DOCUMENTS

| | | | |
|---|---|---|---|
| 2010/0177258 A1* | 7/2010 | Shinozaki | G02F 1/133603 349/58 |
| 2012/0043878 A1* | 2/2012 | Liang | F21V 3/02 313/317 |
| 2012/0081619 A1* | 4/2012 | Shimizu | G02F 1/133603 348/790 |
| 2012/0138771 A1* | 6/2012 | Li | G06F 3/042 250/206.1 |
| 2012/0182757 A1* | 7/2012 | Liang | G02B 6/0006 362/555 |
| 2012/0286314 A1* | 11/2012 | Shinohara | F21V 5/04 257/98 |
| 2012/0320580 A1* | 12/2012 | Liang | G02B 19/0071 362/235 |
| 2013/0148328 A1* | 6/2013 | Park | F21K 9/13 362/84 |
| 2013/0343061 A1* | 12/2013 | Liao | G02B 6/0035 362/296.01 |
| 2014/0211481 A1* | 7/2014 | Liang | F21V 29/004 362/308 |
| 2014/0353695 A1* | 12/2014 | Moon | F21K 9/232 257/89 |
| 2016/0025297 A1* | 1/2016 | Liu | G02B 3/08 362/97.1 |
| 2016/0025322 A1* | 1/2016 | Chen | F21V 29/773 362/373 |
| 2016/0103364 A1* | 4/2016 | Nam | G02F 1/133603 349/69 |
| 2016/0315228 A1* | 10/2016 | Chou | H01L 25/0753 |

\* cited by examiner

LIGHT-EMITTING DISPLAY DEVICE

TECHNICAL FIELD

The present invention relates to a display device, and in particular, to a light-emitting display device having a plurality of light emitting units for emitting light with at least two different wavelengths.

BACKGROUND ART

Outdoor display screens not only require a high level of brightness but also require that a difference in viewing angle between three-primary-color LEDs be within a certain range. However, the technique of adding an optical lens to a three-primary-color light-emitting display device to enhance brightness results in an increased difference in viewing angle. Therefore, in existing structures, the provision of using an optical lens is not suitable.

In view of the above disadvantages, after extensive research in conjunction with theoretical knowledge, the inventor provides the present invention which is reasonably designed and effectively addresses the above disadvantages.

SUMMARY OF THE INVENTION

Embodiments of the present invention provide a multicolor light-emitting display device capable of effectively addressing the potential problems of conventional light-emitting display devices. In the light-emitting display device provided by the embodiments of the present invention, a light guide structure is disposed to focus light emitted by a plurality of light emitting units on a predetermined optical axis, wherein the light guide structure may be a reflecting cup recess structure or an optical element, and so on.

DETAILED DESCRIPTION OF THE PREFERRED EMBODIMENTS

First Embodiment

Figure 1:
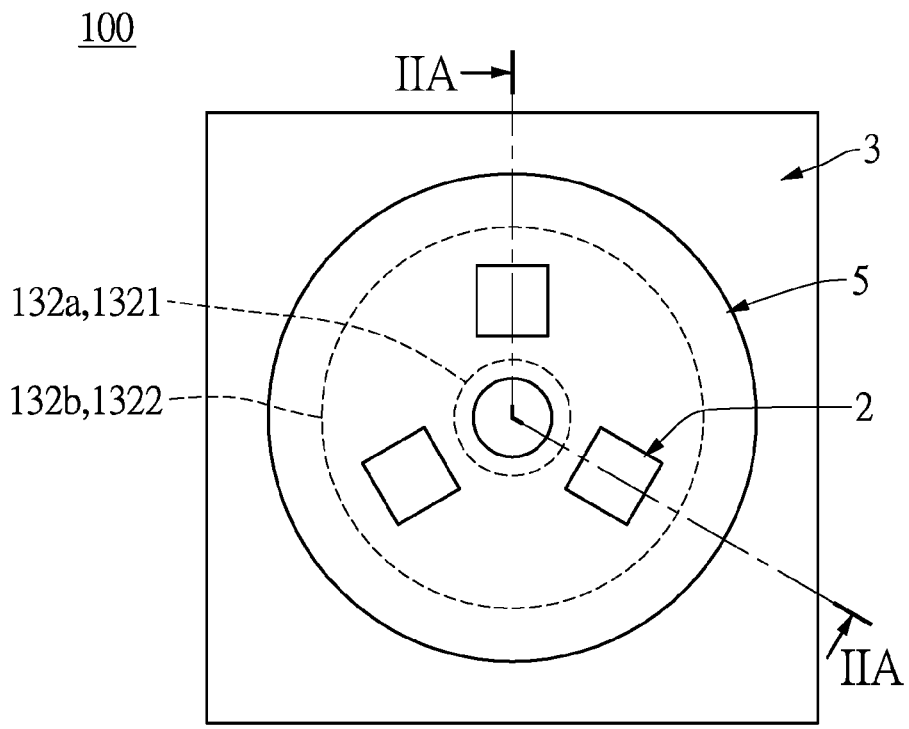
FIG. 1 is a schematic view of a first embodiment of a light-emitting display device according to the present invention.
Figure 2A:
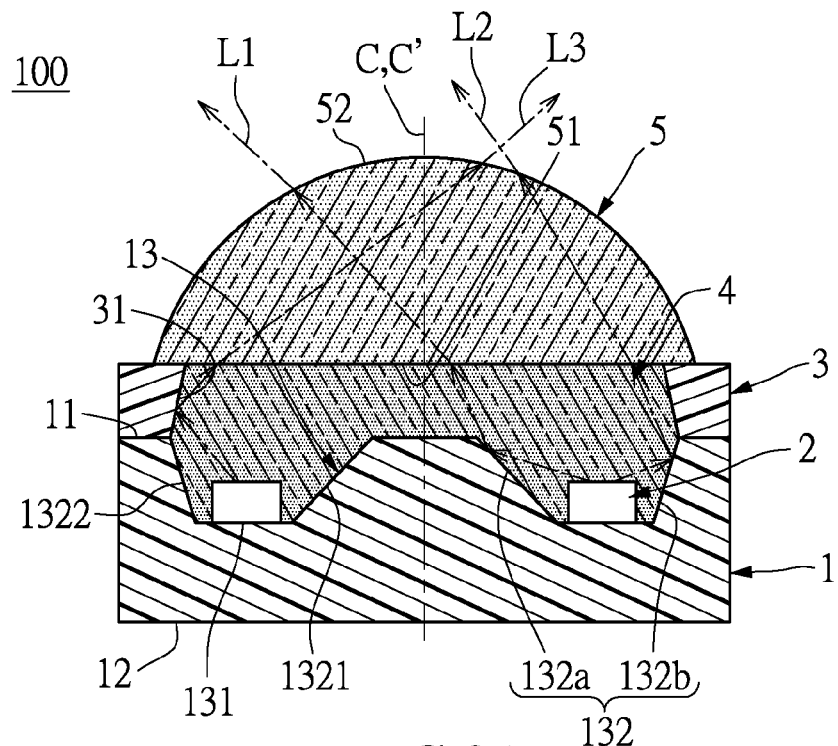
FIG. 2A is a cross-sectional view along line II A-II A of FIG. 1.
Figure 2B:
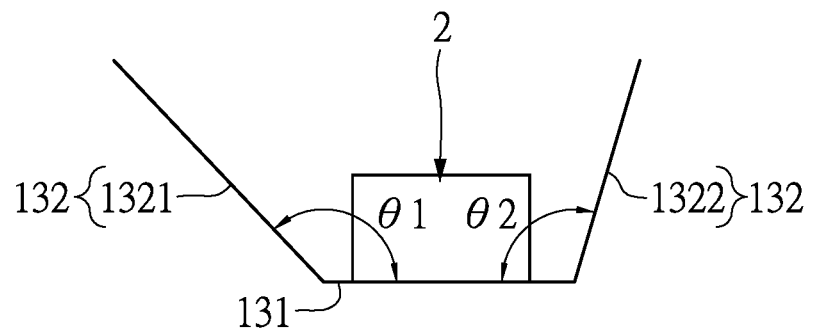
FIG. 2B is an enlarged schematic view of a part of FIG. 2A.
Figure 2C:
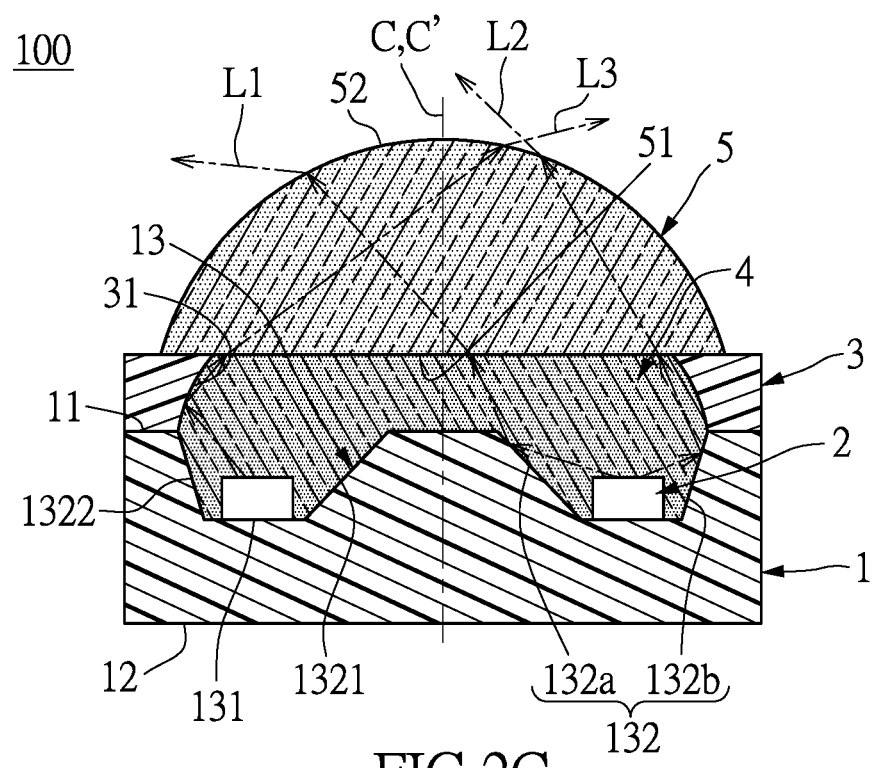
FIG. 2C is a cross-sectional view along line II A-II A of FIG. 1 according to another implementation.
Figure 3:
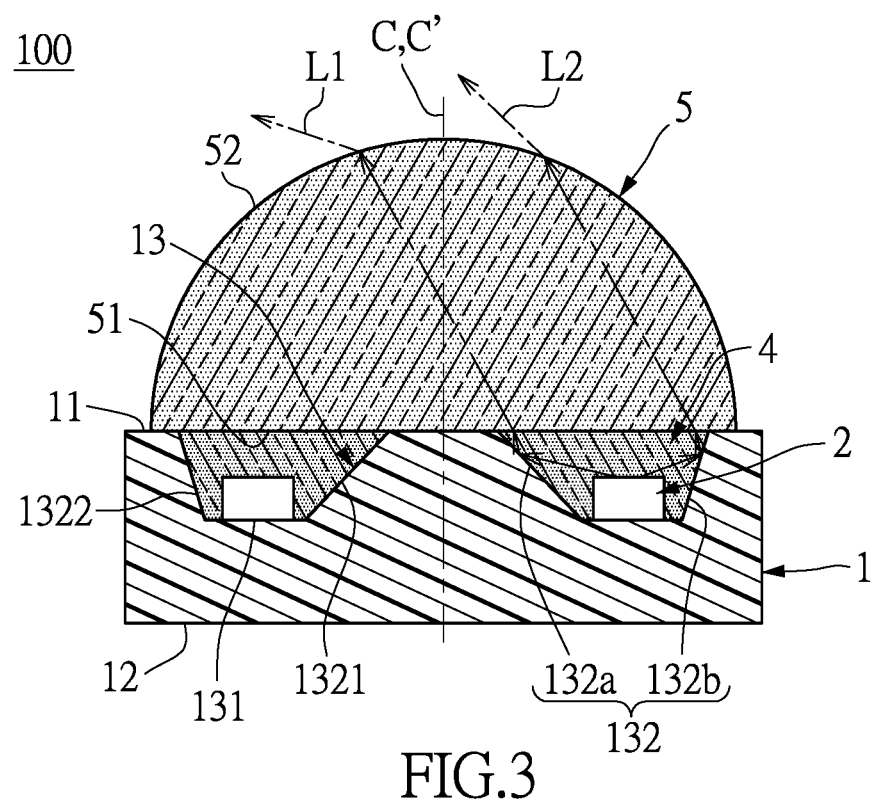
FIG. 3 is a schematic view of the light-emitting display device shown in FIG. 2A with a frame body omitted.

Referring to FIG. 1 to FIG. 3, a first embodiment of the present invention is shown. It should be first noted that the relevant quantities and shapes shown in the figures corresponding to this embodiment are only provided to illustrate particular implementations of the present invention for ease of understanding, and not to limit the scope of the present invention.

As shown in FIG. 1, FIG. 2A and FIG. 2B, this embodiment is a light-emitting display device 100 having a substrate 1, a plurality of light emitting units 2, a frame body 3, an encapsulation 4, and an optical lens 5. The light emitting units 2 and the frame body 3 are disposed on the substrate 1, the encapsulation 4 encapsulates the light emitting units 2, and the optical lens 5 is located on the frame body 3. The specific construction of the light-emitting display device 100 provided by this embodiment is described in general as follows:

The type of the substrate 1 is not limited in this embodiment. For example, the substrate 1 in this embodiment may be a ceramic plate, a printed circuit board, a lead frame, etc. The substrate 1 has a first substrate surface 11 and a second substrate surface 12 (for example, a top surface and a bottom surface of the substrate 1 in FIG. 2A) located at opposite sides. The substrate 1 has a preset (first) optical axis C perpendicular to the first substrate surface 11, the optical axis C corresponding to a second optical axis C' defined by the subsequently disposed optical lens 5. Wherein, most of the light emitted from light emitting units 2 can be concentrated on the (first and second) optical axis C, C' via a light guiding structure. Moreover, the specific location of the optical axis C can vary depending on an implementation of a product. For this embodiment, the optical axis C preset to be perpendicular to the first substrate surface 11 is located approximately at a center of the first substrate surface 11.

A light guide structure of the light-emitting display device 100 includes a receiver 13 which is recessed from the first substrate surface 11 of the substrate and contained the plurality of light emitting units 2, wherein the receiver 13 is capable of guiding light emitted by the light emitting units 2 to the predetermined optical axis C. Further, the receiver 13 of the light guide structure in the implementation of this embodiment has an annular-shape approximately symmetrical with respect to the optical axis C, wherein a center (of a circle) of the receiver 13 is approximately located on the optical axis C. The receiver 13 has a bottom wall 131 and two side walls 132 (i.e., an outer side wall 132b and an inner side wall 132a of the receiver 13 as shown in FIG. 2A) obliquely connected to the bottom wall 131, wherein the two side walls 132 have a light reflecting function. The two side walls 132 may, for example, have a light reflecting function by means of being formed to be smooth or being plated with a light reflecting material, but are not limited thereto.

Further, the two side walls 132 of the receiver 13 have an inner light reflecting portion 1321 proximal to the optical axis C and an outer light reflecting portion 1322 distal from the optical axis C, that is to say, the side wall 132 of the receiver 13 proximal to the optical axis C (i.e., the inner side wall 132a of the receiver 13 as shown in FIG. 2A) is defined as an inner light reflecting portion 1321, and the side wall 132 of the receiver 13 distal from the optical axis C (i.e., the outer side wall 132b of the receiver 13 as shown in FIG. 2A) is defined as an outer light reflecting portion 1322.

An angle θ1 defined by the inner light reflecting portion 1321 and the bottom wall 131 of the receiver 13 is greater than an angle θ2 defined by the outer light reflecting portion 1322 and the bottom wall 131 of the receiver 13, and the angle θ2 defined by the outer light reflecting portion 1322 and the bottom wall 131 of the receiver 13 is not less than 90 degrees. In this embodiment, the angle θ1 defined by the inner light reflecting portion 1321 and the bottom wall 131 of the receiver 13 is approximately 120 degrees to 165 degrees and the angle θ2 defined by the outer light reflecting portion 1322 and the bottom wall 131 of the receiver 13 is approximately 90 degrees to 120 degrees, but in practice, the two angles θ1 and θ2 are not limited thereto.

The light emitting units 2 have chips emitting light of at least two different wavelengths. In other words, the light emitting units 2 has at least one first light emitting unit emitting first light with a first spectrum and at least one second light emitting unit emitting second light with a second spectrum different to the first spectrum. For example, the light emitting units 2 may include a red LED chip, a green LED chip, and a blue LED chip, respectively, but the present invention is not limited thereto. The light emitting units 2 are mounted on the bottom wall 131 of the receiver 13 of the substrate 1, the distances between any two of the light emitting units 2 are approximately the same, and the height of any of the light emitting units 2 is less than the depth of the receiver 13. The light emitted by the light emitting units 2 is mainly emitted upwards. The inner light reflecting portion 1321 and the outer light reflecting portion 1322 comprised in the light guide structure enable light L1 and L2 emitted by the light emitting units 2 to be reflected through their interfaces and then emitted towards the preset optical axis C, thereby collecting polychromatic light emitted by the light emitting units 2 of the light-emitting display device 100 in order to improve the light mixing effect.

In addition to the receiver 13, the light guide structure also has the frame body 3, which is annular and has an annular inner wall surface 31, that is to say, the inner wall surface 31 surrounds and defines a through hole (not labeled). The frame body 3 is disposed on a part of the first substrate surface 11 of the substrate 1 outside the receiver 13. A bottom edge of the inner wall surface 31 of the frame body 3 is substantially connected to a top edge of the outer side wall 132b of the receiver 13. An inner diameter of the inner wall surface 31 of the frame body 3 gradually decreases in a direction moving away from the first substrate surface 11 (i.e., from bottom to top in FIG. 2A). A minimum inner diameter of the inner wall surface 31 is not less than a maximum outer diameter of the bottom wall 131 of the receiver 13. Provided the above conditions are met, the inner wall surface 31 may be a planar surface or a curved surface (as shown in FIG. 2C), and is not limited herein. Accordingly, the inner wall surface 31 of the frame body 3 of the light guide structure enables light L3 emitted by the light emitting units 2 to be reflected towards the optical axis C, that is, the light L3 can be emitted out towards the preset optical axis C after being reflected by the interface of the frame body 3. That is to say that the frame body 3 can be avoid light L3 scattering, decreasing divergence angle of light L3, concentrating light L3 to the pre-determination direction, such as the center.

The optical lens 5 is disposed over the substrate 1 for providing a space to mix the first and the second light emitted from the light emitting units 2. The optical lens 5 has a light input surface 51 and a light output surface 52. A periphery of the light input surface 51 of the optical lens 5 is disposed on a top surface of the frame body 3, the light input surface 51 of the optical lens 5 faces the light emitting units 2. And in this embodiment, the light output surface 52 of the optical lens 5 has a curved convex shape, wherein the convex shaped optical lens 5 has an optical axis identical to the optical axis C, but the present invention is not limited thereto.

Specifically, the optical lens 5 is as medium for mixing lights of different wavelengths for achieving a uniform lighting effect, especially for white light. The optical lens 5 can be formed of any construction or shape, such as square or rectangular. Furthermore, the optical lens 5 has a refractive index between about 1.3 and 1.8, and 1.4 to 1.6 preferably, but the optical lens 5 is not limited thereto.

The encapsulation 4 encapsulates the light emitting units 2. That is to say that the encapsulation 4 is filled in a space defined by at least one of the surfaces 1322, 1321 of the receiver 13, the inner wall surface 31 of the frame body 3, and the light input surface 51 of the optical lens 5. The encapsulation 4 and the optical lens 5 may further include diffusers. The concentration of the diffusers in the encapsulation 4 is not less than that in the optical lens 5. The percentage concentration by weight of the diffusers in the encapsulation 4 is 0.1% to 0.5% in the present embodiment and the percentage concentration by weight of the diffusers in the optical lens 5 is 0.05% to 0.1% in the present embodiment. Therefore, light L1 to L3 are emitted by the light emitting units 2 and pass through the encapsulation 4 to the optical lens 5; that is, the light passes from a more optically dense material to a less optically dense material. Furthermore, the material of the diffusers in the present embodiment is silicon dioxide or titanium dioxide preferred, but the present invention is not limited thereto.

From the above description, in the light-emitting display device 100 provided in the present embodiment, the light guide structure (for example, the inner light reflecting portion 1321, the outer light reflecting portion 1322, and the inner wall surface 31 of the frame body 3) is disposed to enable the light L1 to L3 emitted by the light emitting units 2 to be emitted out towards the preset optical axis C after being respectively reflected by the surface of the light guide structure. More particularly, the light L1 to L3 may be deflected when passing through the light input surface 51 of the optical lens 5 from the encapsulation 4 because the optical lens 5 and the encapsulation 4 have different refractive indices. The light L1 to L3 travel from the encapsulation 4 (the more optically dense material) to the optical lens 5 (the less optically dense material), such that the light L1 to L3 entering the optical lens 5 are deflected in a direction away from a normal direction, that is to say, a refraction angle is greater than an incidence angle. Similarly, on being emitted to the outside (air) through the light output surface 52 of the optical lens 5, the light L1 to L3 are deflected again in a direction away from the normal direction and then emitted, due to travel of the light L1 to L3 from the more optically dense material (the optical lens 5) to a less optically dense material (air), in addition to an optical design of the curved surface of the optical lens 5. That is to say, an angle of the light L1 to L3 can be appropriately adjusted by the optical lens 5 to provide a desired light distribution. After passing through different media and being reflected and refracted, the light emitted from light emitting units 2 which include at least two different wavelengths finally can be introduced to predetermined various directions and then emitted from different locations of the optical lens 5 and at different angles, thereby achieving the purpose of light mixing, especially for uniform white light.

Accordingly, with the construction of the optical lens 5 and the plurality of light emitting units 2 emitting light of different wavelengths, the light-emitting display device 100 in this embodiment still enables a difference in viewing angle to be limited within a certain range and thus can be applied to an outdoor display screen.

Moreover, the light-emitting display device 100 provided in this embodiment may also be adjusted according to requirements of a designer and is not limited to the implementation shown in FIG. 2A. For example, as shown in FIG. 3, in the case that the light reflecting effects of the inner light reflecting portion 1321 and the outer light reflecting portion 1322 are sufficient to meet requirements, the frame body 3 may also be omitted from the light-emitting display device 100.

Second Embodiment

Referring to FIG. 4 to FIG. 7, a second embodiment of the present invention is shown. The second embodiment is similar to the first embodiment and therefore the similar portions will not be described again below. The main differences between the two embodiments are that: a plurality of receivers 13 are formed in the substrate 1 in this embodiment and, corresponding to the receivers 13 disposed in the substrate 1, a plurality of annular inner wall surfaces 31 are formed in the frame body 3. That is, the light guide structure in this embodiment has a plurality of receivers 13 or further a plurality of annular inner wall surfaces 31 of the frame body 3 disposed on corresponding ones thereof.

Figure 4:
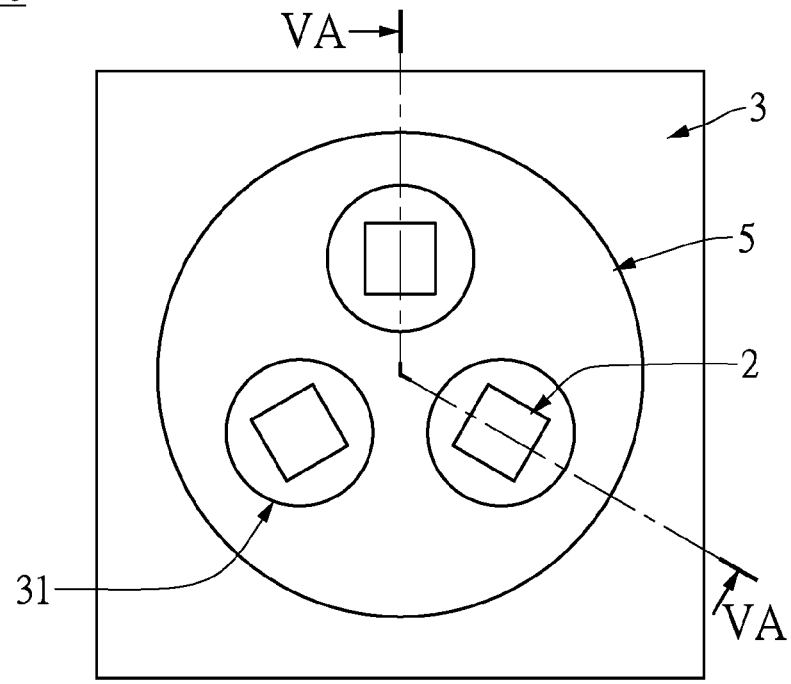
FIG. 4 is a schematic view of a second embodiment of a light-emitting display device according to the present invention.
Figure 5A:
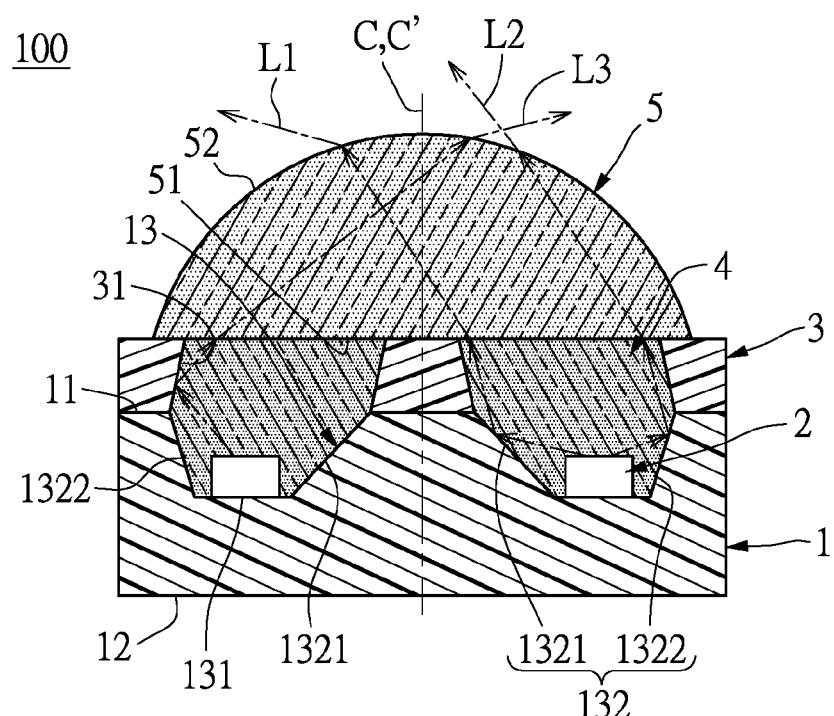
FIG. 5A is a cross-sectional view along line VA-VA of FIG. 4.
Figure 5B:
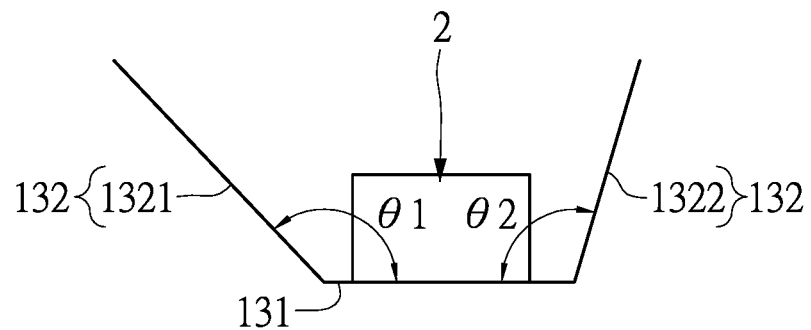
FIG. 5B is an enlarged schematic view of a part of FIG. 5A.
Figure 5C:
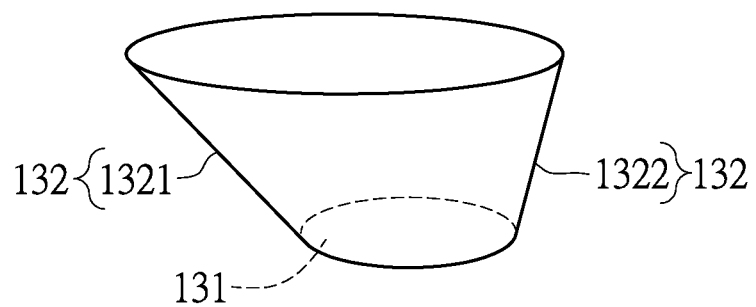
FIG. 5C is a perspective view of a receiver of the second embodiment of the light-emitting display device according to the present invention.

Specifically, as shown in FIG. 4 to FIG. 5C, the plurality of receivers 13 are recessed from the first substrate surface 11 of the substrate 1, where the receivers 13 are arranged approximately symmetrically with respect to the preset optical axis C, and the light emitting units 2 are mounted on the bottom walls 131 of the receivers 13 respectively. Each of the receivers 13 has an approximately circular bottom wall 131 and a side wall 132 obliquely connected to the periphery of the bottom wall 131. Further, a corresponding opening formed at a top edge of the side wall 132 of the receiver 13 is also approximately circular. The side wall 132 has a light reflecting function. For example, the side wall 132 may have the light reflecting function as a result of being formed to be smooth or being plated with a light reflecting material, but is not limited thereto.

Further, an angle defined by the side wall 132 of each receiver 13 and the bottom wall 131 thereof gradually decreases in a direction moving away from the optical axis C. A part of the side wall 132 of each receiver 13 proximal to the optical axis C (i.e., an inner edge part of the side wall 132 of the receiver 13 as shown in FIG. 5A) is defined as an inner light reflecting portion 1321, and a part of the side wall 132 of the receiver 13 distal from the optical axis C (i.e., an outer edge part of the side wall 132 of the receiver 13 as shown in FIG. 5A) is defined as an outer light reflecting portion 1322.

Furthermore, as shown in FIG. 5B, for each receiver 13, an angle $\theta 1$ defined by the inner light reflecting portion 1321 and the bottom wall 131 of the receiver 13 is greater than an angle $\theta 2$ defined by the outer light reflecting portion 1322 and the bottom wall 131 of the receiver 13, and the angle $\theta 2$ defined by the outer light reflecting portion 1322 and the bottom wall 131 of the receiver 13 is not less than 90 degrees. The angle $\theta 1$ defined by the inner light reflecting portion 1321 and the bottom wall 131 of the receiver 13 is approximately 120 degrees to 165 degrees and the angle $\theta 2$ defined by the outer light reflecting portion 1322 and the bottom wall 131 of the receiver 13 is approximately 90 degrees to 120 degrees. Accordingly, the inner light reflecting portion 1321 and the outer light reflecting portion 1322 comprised in each receiver 13 of the light guide structure enable light L1 and L2 emitted by the corresponding light emitting unit 2 to be reflected through their interfaces and then emitted towards the preset central axis C, thereby collecting polychromatic light emitted by the light emitting units 2 of the light-emitting display device 100 in order to improve the light mixing effect.

Figure 6A:
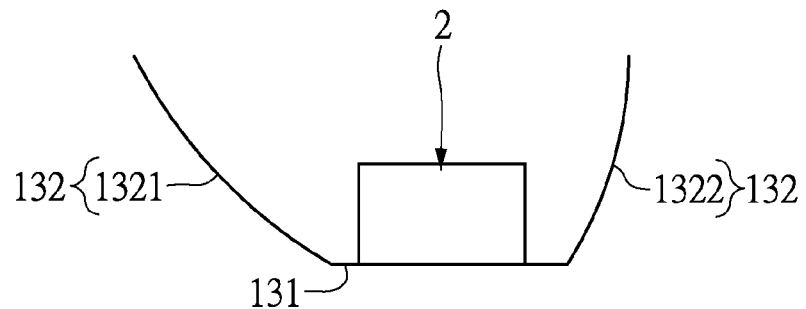
FIG. 6A is an enlarged schematic view of a part of FIG. 5A according to another implementation.
Figure 6B:
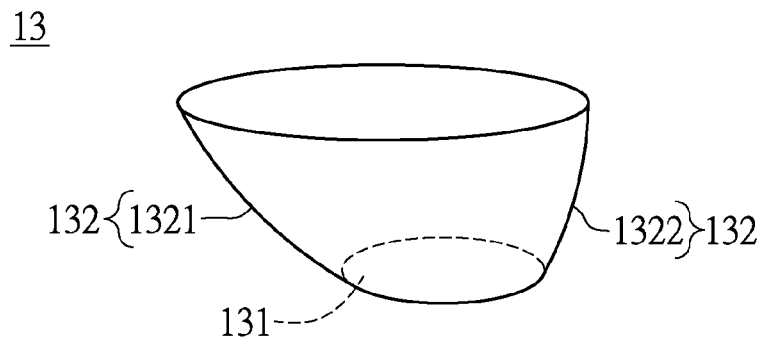
FIG. 6B is a perspective view of a receiver of FIG. 6A.

Moreover, the receivers 13 provided in this embodiment may also be adjusted according to requirements of a designer and are not limited to the implementation shown in FIG. 5B. For example, as shown in FIG. 6A and FIG. 6B, the side wall 132 of each receiver 13 may be an arc-shaped concave surface, that is, the receiver 13 may be a bowl-shaped construction.

The frame body 3, as the other part of the light guide structure, has a plurality of near-circular through holes (not labeled), that is to say, the plurality of annular inner wall surfaces 31 of the frame body 3 respectively surround and define the circular through holes separated from each other, and the locations of the circular through holes are arranged approximately symmetrically with respect to the preset optical axis C. The frame body 3 is disposed on a part of the first substrate surface 11 outside the receivers 13. Moreover, the through holes of the frame body 3 are respectively corresponding in position to the receivers 13 of the substrate 1. That is to say, bottom edges of the inner wall surfaces 31 of the frame body 3 are substantially connected to top edges of the side walls 132 of the receivers 13 respectively. An inner diameter of each of the inner wall surfaces 31 of the frame body 3 gradually decreases in a direction moving away from the first substrate surface 11 (from bottom to top in FIG. 5A). A minimum inner diameter of each of the inner wall surfaces 31 is not less than a maximum outer diameter of the bottom wall 131 of the corresponding receiver 13. Provided the above conditions are met, the inner wall surface 31 may be a planar surface or a curved surface (not shown), but is not limited thereto. Accordingly, the inner wall surfaces 31 of the frame body 3 of the light guide structure enable light L3 emitted by the light emitting units 2 to be reflected towards the optical axis C, thereby collecting the light emitted by the light emitting units 2 of the light-emitting display device 100; that is, the light L3 can be emitted towards the preset central axis C after being reflected by the interface of the frame body 3.

The light-emitting display device 100 has a plurality of encapsulation bodies 4. Spaces surrounded by the receivers 13 and the corresponding inner wall surfaces 31 of the frame body 3 are respectively filled with the encapsulation bodies 4; that is to say, a space surrounded by each of the receivers 13, the corresponding inner wall surface 31 of the frame body 3, and the light input surface 51 of the optical lens 5 is filled with the encapsulation 4 so that the encapsulation bodies 4 completely encapsulate the light emitting units 2.

From the above description, in the light-emitting display device 100 provided in the present embodiment, the light guide structure (for example, the inner light reflecting portion 1321, the outer light reflecting portion 1322, and the inner wall surface 31 of the frame body 3) is disposed to enable the light L1 to L3 emitted by the light emitting units 2 to be emitted out towards the preset optical axis C after each being reflected by the surface of the light guide structure. More particularly, the light L1 to L3 may be deflected when passing through the light input surface 51 of the optical lens 5 from the encapsulation 4 because the optical lens 5 and the encapsulation 4 have different refractive indices. The light L1 to L3 travel from the encapsulation 4 (a more optically dense material) to the optical lens 5 (a less optically dense material), so the light L1 to L3 entering the optical lens 5 are deflected in a direction away from a normal direction, that is to say, a refraction angle is greater than an incidence angle. Similarly, on being emitted to the outside (air) through the light output surface 52 of the optical lens 5, the light L1 to L3 are deflected again in a direction away from the normal direction and then emitted, due to travel of the light L1 to L3 from the optically denser material (the optical lens 5) to a less optically dense material (air), in addition to an optical design of the curved surface of the optical lens 5. That is to say, the angles of the lights L1 to L3 can be appropriately adjusted by the optical lens 5 to provide a desired light distribution. After passing through different media and being reflected and refracted, the light L1 to L3 of different colors are finally emitted from different locations of the optical lens 5 at different angles, thereby achieving the purpose of light mixing, especially for uniform white light.

Figure 7:
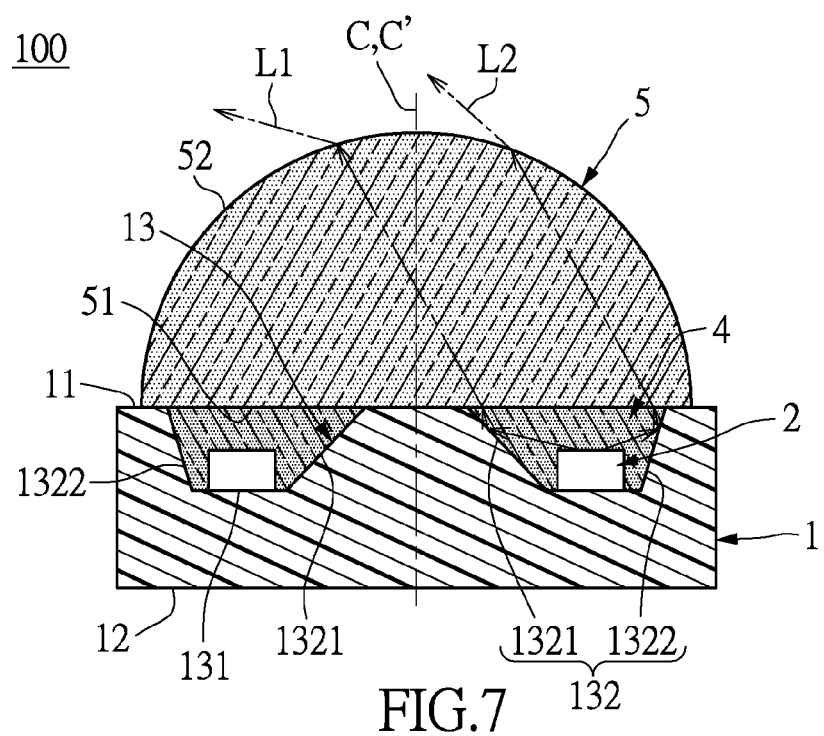
FIG. 7 is a cross-sectional view of the light-emitting display device shown in FIG. 5A with a frame body omitted.

Moreover, the light-emitting display device 100 provided in this embodiment may also be adjusted according to requirements of a designer and is not limited to the implementation shown in FIG. 5A. For example, as shown in FIG. 7, provided that the light reflecting effects of the inner light reflecting portion 1321 and the outer light reflecting portion 1322 of each of the receivers 13 are sufficient to meet requirements, the frame body 3 may also be omitted from the light-emitting display device 100. Accordingly, the light guide structure of the light-emitting display device 100 can be formed as the plurality of the predetermined profile receivers 13 which are containing the plurality of light emitting units 2. Moreover, the plurality of receivers 13 can be connected to form an annular-shape. Further, the light guide structure may include the frame body 3 with a plurality of predetermined profile through holes. The plurality of through holes of the frame body 3 also can be connected to form a bulk hole with predetermined profile.

Third Embodiment

Referring to FIG. 8 to FIG. 12, a third embodiment of the present invention is shown. It should be first noted that, the relevant quantities and shapes shown in the figures corresponding to this embodiment are only provided to illustrate particular implementations of the present invention for ease of understanding, and not to limit the scope of the present invention.

Figure 8:
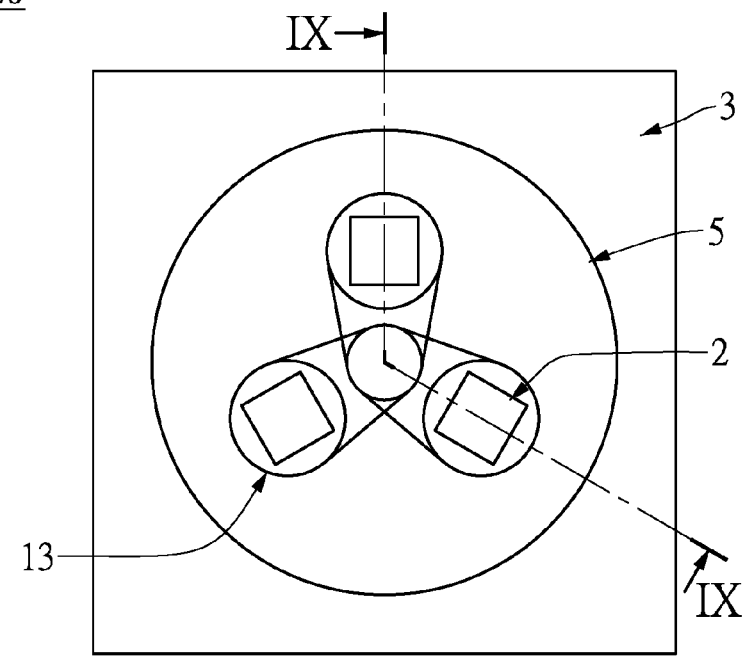
FIG. 8 is a schematic view of a third embodiment of a light-emitting display device according to the present invention.
Figure 9:
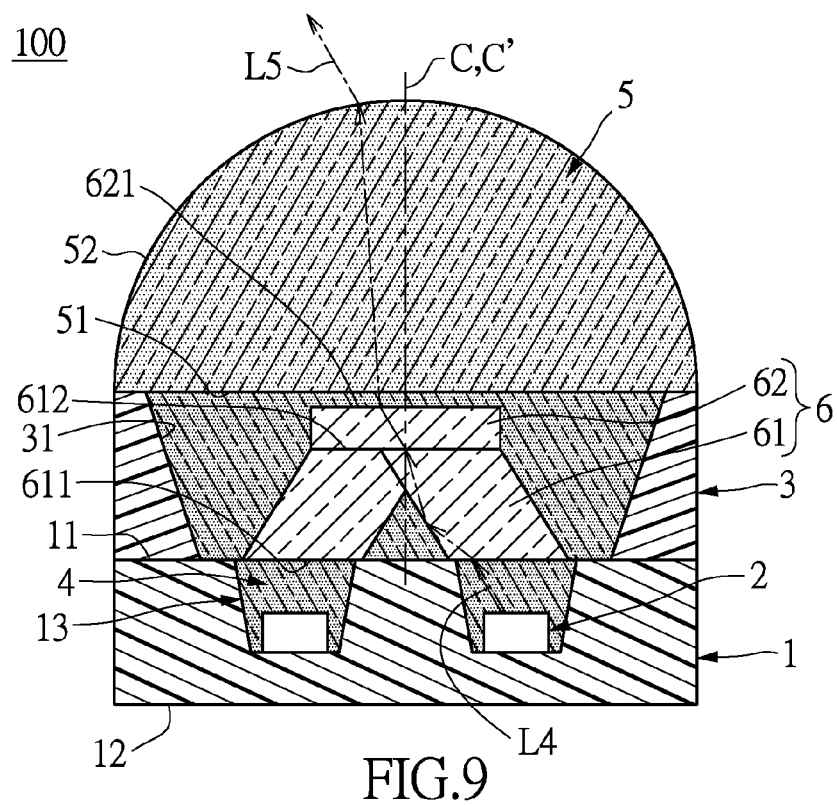
FIG. 9 is a cross-sectional view along line I X-I X of FIG. 8.

As shown in FIG. 8 and FIG. 9, a light-emitting display device 100 has a substrate 1, a plurality of light emitting units 2, a frame body 3, an optical element 6, and an optical lens 5. The light emitting units 2 and the frame body 3 are disposed on the substrate 1, the optical element 6 is disposed on a light output path of the light emitting units 2, and the optical lens 5 is located on the frame body 3. The specific construction of the light-emitting display device 100 provided by this embodiment is described in general as follows:

The type of the substrate 1 is not limited in this embodiment. For example, the substrate 1 in this embodiment may a ceramic plate, a printed circuit board, a lead frame, etc. The substrate 1 has a first substrate surface 11 and a second substrate surface 12 (for example, a top surface and a bottom surface of the substrate 1 in FIG. 9) located at opposite sides. The substrate 1 defines a preset (first) optical axis C perpendicular to the first substrate surface 11, the optical axis C in the instant embodiment is corresponding to a second optical axis C' defined by the subsequently disposed optical lens 5. Wherein, most of the light emitted from light emitting units 2 can be concentrated on the (first and second) optical axis C, C' via a light guiding structure. A plurality of receivers 13 are recessed from the first substrate surface 11 of substrate 1, and the receivers 13 are arranged approximately symmetrically with respect to the optical axis C. Moreover, the specific location of the optical axis C can vary depending on an implementation of a product. For this embodiment, the optical axis C preset to be perpendicular to the first substrate surface 11 is approximately located at a center of the first substrate surface 11.

The light emitting units 2 have chips emitting light of at least two different wavelengths. In this embodiment, the light emitting units 2 are a red light emitting unit, a green light emitting unit, and a blue light emitting unit, respectively, but the present invention is not limited thereto. The light emitting units 2 are mounted on the bottom walls 131 of the receivers 13 of the substrate 1 respectively, the distances between any two of the light emitting units 2 are approximately the same, and the height of any of the light emitting units 2 is less than the depth of the corresponding receiver 13. The light emitted by the light emitting units 2 is mainly emitted upwards.

Furthermore, each of the receivers 13 may be further filled with an encapsulation 4 to encapsulate the light emitting units 2 in the receiver 13. However, in practice, the receivers 13 may not be filled with the encapsulation bodies 4.

The frame body 3 is annular and has an annular inner wall surface 31, that is to say, the inner wall surface 31 surrounds and defines a through hole (not labeled). The frame body 3 is disposed on a part of the first substrate surface 11 of the substrate 1 outside the receivers 13. The height of the frame body 3 corresponding to the optical axis C is not less than the height of the optical element 6 corresponding to the optical axis C.

The light-emitting display device 100 has a light guide structure. The light guide structure has the optical element 6 disposed in a space surrounded by the inner wall surface 31 of the frame body 3. The optical element 6 has a plurality of light guide posts 61 at an oblique angle and a light mixing block 62, and the number of the light guide posts 61 equals the number of the light emitting units 2. The relative locations of the plurality of light guide posts 61 in the implementation of this embodiment are symmetrical with respect to the optical axis C. Each of the light guide posts 61 has a light input end 611 and a light output end 612. The light input ends 611 of the light guide posts 61 face the light emitting units 2 respectively and completely cover openings of the receivers 13 respectively. The light output ends 612 of the light guide posts 61 are disposed adjacent to each other and connected to the light mixing block 62. In this embodiment, the light output ends 612 of the light guide posts 61 are integrally connected to the light mixing block 62, but the light guide posts 61 and the light mixing block 62 may also be members capable of being assembled separately. Moreover, the light guide posts 61 slant from the light input ends 611 to the light output ends 612, that is, the light guide posts 61 incline toward the light mixing block 62 or the preset optical axis C.

In addition, the light guide structure of the light-emitting display device 100 also can be optionally composed of the plurality of receivers 13 which are recessed from the first substrate surface 11 of the substrate 1, or the optical element 6 can be optionally formed of a plurality of light guide posts 61 or a light mixing block 62.

Moreover, the refractive index of each light guide posts 61 is greater than that of the optical lens 5, thereby achieving a total reflection, which occurs in the light-emitting display device 100.

Accordingly, on passing through the optical element 6, light L4 emitted by the light emitting units 2 is guided by the light guide posts 61 disposed correspondingly and having the oblique angles, transferred from the light input ends 611 separate from each other to the light output ends 612 adjacent to each other and mixed in the light mixing block 62. A surface of the light mixing block 62 distal from the light guide posts 61 is a rough surface 621, such that light L5 emitted from the rough surface 621 has a good light mixing effect.

Figure 10:
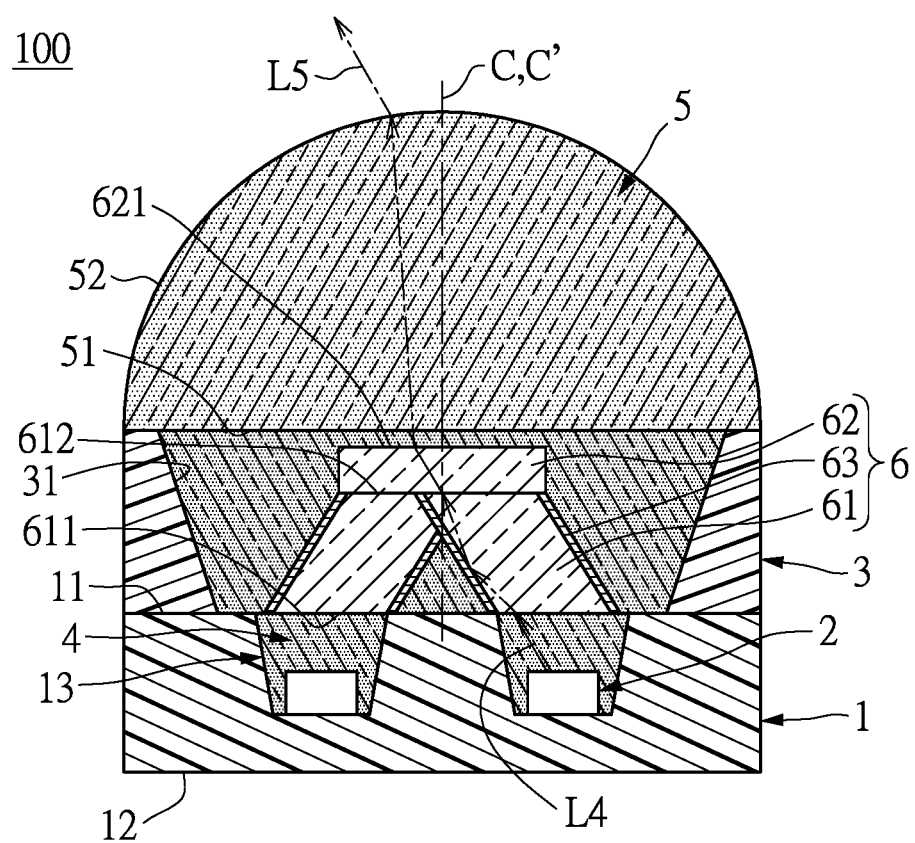
FIG. 10 is a cross-sectional view of the light-emitting display device shown in FIG. 9 plated with a reflecting layer.

Furthermore, in order to intensify the light guide effect of the light guide posts 61, a part of a surface of each of the light guide posts 61 outside the light input end 611 and the light output end 612 may also be plated with a reflecting layer 63 (as shown in FIG. 10), so that the light L4 entering the light guide post 61 from the light input end 611 can be completely emitted from the light output end 612, thereby achieving an effect of reducing light loss.

The optical lens 5 has a light input surface 51 and a light output surface 52. A periphery of the light input surface 51 of the optical lens 5 is disposed on a top surface of the frame body 3. The light input surface 51 of the optical lens 5 faces the optical element 6, that is, it is adjacent to or is fitted to the optical element 6 and further faces the rough surface 621 of the light mixing block 62 of the optical element 6. The light output surface 52 of the optical lens 5 has a curved convex shape.

From the above description, in the light-emitting display device 100 provided in this embodiment, the light guide structure (for example, the light guide posts 61 and the light mixing block 62 of the optical element 6) is disposed to enable the light L4 emitted by the light emitting units 2 to be reflected by surfaces of the light guide posts 61 slanting toward the preset optical axis C, then enter the light mixing block 62 to be collected and mixed, and then enter the optical lens 5. More particularly, the light L4 may be deflected when passing through the light input ends 611 of the light guide posts 61 from the encapsulation 4 because the light guide posts 61 and the encapsulation 4 have different refractive indices. The light L4 travels from the encapsulation 4 (a more optically dense material) to the light guide posts 61 (a less optically dense material), such that the light L4 entering the light guide posts 61 is deflected in a direction away from a normal direction, that is to say, a refraction angle is greater than an incidence angle. When passing through the light output ends 612 of the light guide posts 61 to enter the light mixing block 62, the light L4 is collected and mixed in the light mixing block 62. Moreover, after light L5 emitted from the light mixing block 62 enters the optical lens 5, the light L5 is deflected again in a direction away from the normal direction and then emitted out as the light L5 travels from the optical lens (a more optically dense material) to air (a less optically dense material), due to an optical design of the curved surface of the optical lens 5. That is to say, the angle of the light L5 can be appropriately adjusted by the optical lens 5 to provide a desired light distribution. After passing through different media and being reflected and refracted, the light L5 of different colors is finally emitted from different locations of the optical lens 5 at different angles.

Accordingly, owing to the construction of the optical lens 5 and the plurality of light emitting units 2 emitting light of different wavelengths, the light-emitting display device 100 in this embodiment still enables a difference in viewing angle to be limited within a certain range and thus can be applied to an outdoor display screen.

Figure 11:
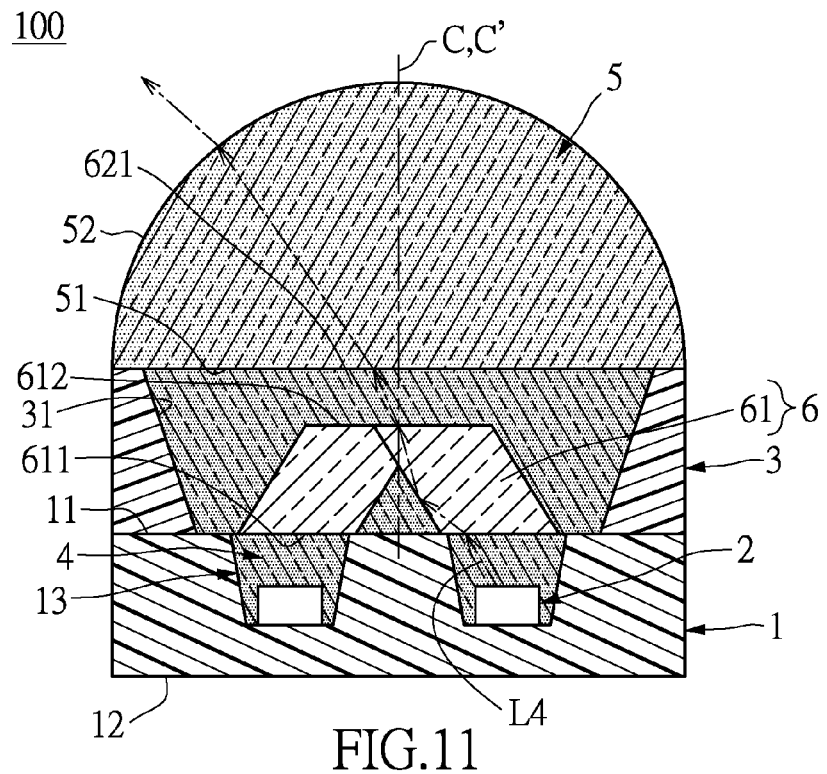
FIG. 11 is a cross-sectional view of the light-emitting display device shown in FIG. 9 not disposed with a light mixing block.
Figure 12:
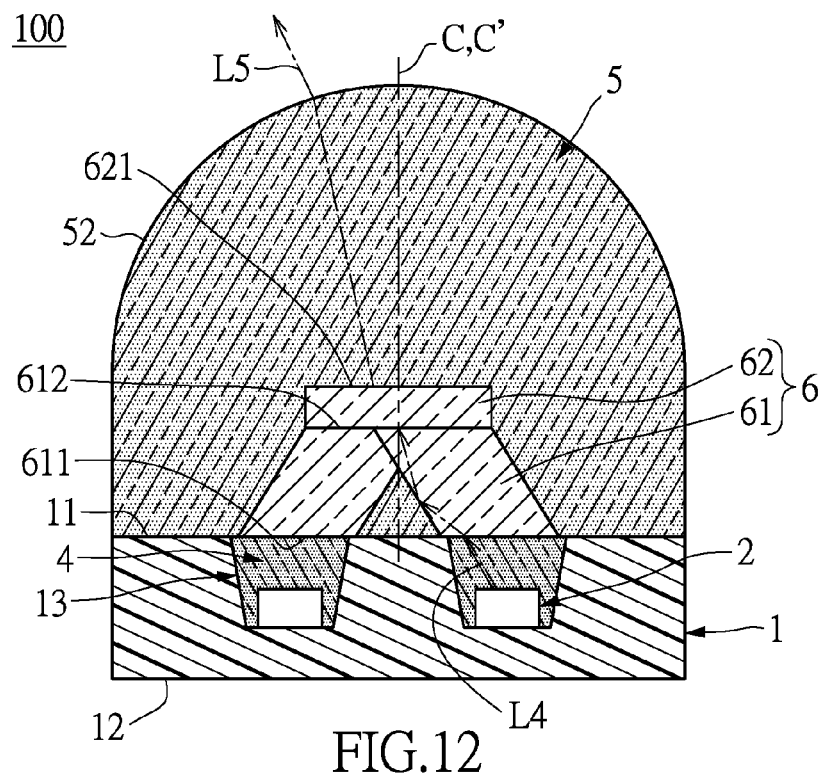
FIG. 12 is a cross-sectional view of the light-emitting display device shown in FIG. 9 not disposed with a frame body.

Moreover, the light-emitting display device 100 provided in this embodiment may also be adjusted according to requirements of a designer and is not limited to the implementations shown in FIG. 8 to FIG. 10. For example, as shown in FIG. 11, the light mixing block 62 may be omitted from the optical element 6 of the light-emitting display device 100, in which case the light L4 emitted by the light emitting units 2 is guided by the light guide posts 61 having the oblique angles, transferred from the light input ends 611 to the light output ends 612 disposed adjacent to each other in a direction toward the preset optical axis C and directly enter the optical lens 5. Alternatively, as shown in FIG. 12, the frame body 3 may be omitted from the light-emitting display device 100, and the optical lens 5 may be molded onto the first substrate surface 11 of the substrate 1 so that the optical element 6 is embedded in the optical lens 5. Alternatively, the frame body 3 may be integrally formed as one body with the substrate 1 (not shown).

Accordingly, the light guide structure of the light-emitting display device 100 can be an optical element 6 which is formed over the light emitting units 2. For example, the light guide structure can include at least one of a plurality of light guide posts 61, and a light mixing block 62 of the optical element 6 selectively. The light guide structure may further include a plurality of receivers 13 which are containing a plurality of light emitting units 2 and corresponding with the plurality of light guide posts 61 or the light mixing block 62.

[Possible Effects of the Embodiments of the Present Invention]

In summary, in the light-emitting display devices provided in the first embodiment and the second embodiment of the present invention, the inner light reflecting portion and the outer light reflecting portion forming different angles with the bottom wall of the receiver enable light emitted by the light emitting units to be reflected towards the optical axis and thus collected, and then enter the optical lens. Accordingly, owing to the construction of the optical lens and the plurality of light emitting units emitting light of different wavelengths, the light-emitting display device of the present embodiments still limits a difference in viewing angle to be within a certain range and thus can be applied to an outdoor display screen.

Furthermore, in the light-emitting display device provided by the third embodiment, the light guide posts and the light mixing block of the optical element are disposed so that the light emitted by the light emitting units is collected and mixed in the light mixing block and then enters the optical lens. Accordingly, owing to the construction of the optical lens and the plurality of light emitting units emitting light of different wavelengths, the light-emitting display device of the present embodiments still limits a difference in viewing angle to be within a certain range and thus can be applied to an outdoor display screen.

The above description only provides preferred practical embodiments of the present invention, and is not intended to limit the scope of the present invention. All equivalent changes and modifications made according to the claims of the present invention should fall within the scope of the present invention.

What is claimed is:

1. A light-emitting display device, comprising:
a substrate, having a first substrate surface and a second substrate surface located at opposite sides, wherein the substrate has a preset optical axis perpendicular to the first substrate surface, and at least one receiver is recessed from the first substrate surface of the substrate; wherein a side wall of the receiver has an inner light reflecting portion proximal to the optical axis and an outer light reflecting portion distal from the optical axis, an angle defined by the inner light reflecting portion and a bottom wall of the receiver is greater than an angle defined by the outer light reflecting portion and the bottom wall of the receiver, and the angle defined by the outer light reflecting portion and the bottom wall of the receiver is not less than 90 degrees;
a plurality of light emitting units, wherein the light emitting units has at least one first light emitting unit emitting first light with a first spectrum and at least one second light emitting unit emitting second light with a second spectrum different to the first spectrum, wherein the light emitting units are disposed in the receiver of the substrate and the height of each of the light emitting units is less than the depth of the receiver; wherein the inner light reflecting portion and the outer light reflecting portion enable light emitted by the light emitting units to be reflected towards the optical axis; and
an optical lens disposed over the substrate for mixing the first and the second light emitted from the light emitting units.

2. The light-emitting display device of claim 1, wherein only one of the receivers is formed in the substrate, and the receiver is of an annular shape substantially symmetrical with respect to the optical axis; an inner side wall of the receiver proximal to the optical axis is defined as the inner light reflecting portion; and an outer side wall of the receiver distal from the optical axis is defined as the outer light reflecting portion.

3. The light-emitting display device of claim 1, wherein a plurality of the receivers are formed in the substrate and the receivers are arranged symmetrically with respect to the optical axis, the light emitting units are mounted on bottom walls of the receivers respectively; and an angle defined by the side wall of each of the receivers and the bottom wall thereof gradually decreases in a direction moving away from the optical axis.

4. The light-emitting display device of claim 2, further comprising a frame body, wherein the frame body has at least one annular inner wall surface, the number of the inner wall surfaces of the frame body equals the number of the receivers in the substrate, the frame body is disposed on a part of the first substrate surface outside the receiver in the substrate, the inner wall surface of the frame body is substantially connected to the side wall of the receiver in the substrate, an inner diameter of the inner wall surface of the frame body gradually decreases in a direction moving away from the first substrate surface, and the inner wall surfaces of the frame body respectively enable the light emitted by the light emitting units to be reflected towards the optical axis.

5. The light-emitting display device of claim 4, further comprising at least one encapsulation, wherein the number of the encapsulation bodies equals the number of the receivers in the substrate, spaces surrounded by the receiver in the substrate and the corresponding inner wall surface of the frame body are filled with the at least one encapsulation, and the concentration of diffusers in the at least one encapsulation is not less than the concentration of diffusers in the optical lens.

6. The light-emitting display device of claim 2, wherein in the receiver in the substrate, the angle defined by the inner light reflecting portion and the bottom wall of the corresponding receiver is approximately 120 degrees to 165 degrees and the angle defined by the outer light reflecting portion and the bottom wall of the corresponding receiver is approximately 90 degrees to 120 degrees.

7. The light-emitting display device of claim 3, further comprising a frame body, wherein the frame body has at least one annular inner wall surface, the number of the inner wall surfaces of the frame body equals the number of the receivers in the substrate, the frame body is disposed on a part of the first substrate surface outside the receiver in the substrate, the inner wall surface of the frame body is substantially connected to the side wall of the receiver in the substrate, an inner diameter of the inner wall surface of the frame body gradually decreases in a direction moving away from the first substrate surface, and the inner wall surfaces of the frame body respectively enable the light emitted by the light emitting units to be reflected towards the optical axis.

8. The light-emitting display device of claim 7, further comprising at least one encapsulation, wherein the number of the encapsulation bodies equals the number of the receivers in the substrate, spaces surrounded by the receiver in the substrate and the corresponding inner wall surface of the frame body are filled with the at least one encapsulation, and the concentration of diffusers in the at least one encapsulation is not less than the concentration of diffusers in the optical lens.

9. The light-emitting display device of claim 3, wherein in the receiver in the substrate, the angle defined by the inner light reflecting portion and the bottom wall of the corresponding receiver is approximately 120 degrees to 165 degrees and the angle defined by the outer light reflecting portion and the bottom wall of the corresponding receiver is approximately 90 degrees to 120 degrees.

10. The light-emitting display device of claim 1, wherein the light emitting units are a red light emitting unit, a green light emitting unit, and a blue light emitting unit respectively.

11. The light-emitting display device of claim 1, wherein the optical lens has a light input surface and a light output surface, the light input surface of the optical lens faces the light emitting units and the light output surface has a curved convex shape.

12. A light-emitting display device, comprising:
a substrate, having a first substrate surface and a second substrate surface located at opposite sides, wherein the substrate has a preset optical axis perpendicular to the first substrate surface at an approximate center of the first substrate surface, and a plurality of receivers are recessed from the first substrate surface of the substrate;
a plurality of light emitting units, wherein the light emitting units has at least one first light emitting unit emitting first light with a first spectrum and at least one second light emitting unit emitting second light with a second spectrum different to the first spectrum, wherein the light emitting units are disposed in the receivers respectively and the height of any of the light emitting units is less than the depth of the corresponding receiver; and an optical element, comprising a plurality of light guide posts, wherein each of the light guide posts has a light input end and a light output end, the light input ends of the light guide posts face the light emitting units respectively, and the light output ends of the light guide posts are disposed adjacent to each other; wherein the optical element enables light emitted by the light emitting units to be respectively guided by the light guide posts and transferred from the light input ends to the light output ends; and an optical lens disposed over the substrate for mixing the first and the second light emitted from the light emitting units.

13. The light-emitting display device of claim 12, wherein the light inlet ends of the light guide posts completely cover openings of the receivers respectively.

14. The light-emitting display device of claim 12, wherein the optical element comprises a light mixing block, the light output ends of the light guide posts are connected to the light mixing block, and the optical element enables the light emitted by the light emitting units to be respectively guided by the light guide posts and then mixed in the light mixing block.

15. The light-emitting display device of claim 12, wherein a part of a surface of each of the light guide posts outside the light input end and the light output end is plated with a reflecting layer.

16. The light-emitting display device of claim 12, further comprising an annular frame body, wherein the frame body is disposed on a part of the first substrate surface outside the receivers, a periphery of the light input surface of the optical lens is pressed against the frame body, and the optical element is disposed in a space surrounded by the frame body.

17. The light-emitting display device of claim 12, wherein the light emitting units are a red light emitting unit, a green light emitting unit, and a blue light emitting unit respectively.

18. The light-emitting display device of claim 12, wherein the optical lens has a light input surface and a light output surface, the light input surface of the optical lens faces the light emitting units and the light output surface has a curved convex shape.

* * * * *